United States Patent
De Felice

(10) Patent No.: US 10,098,255 B2
(45) Date of Patent: Oct. 9, 2018

(54) VENT CONTROL APPARATUS AND METHOD

(71) Applicant: Schrofftech Technologies International, Inc., North Kingstown, RI (US)

(72) Inventor: Richard De Felice, Califon, NJ (US)

(73) Assignee: Schrofftech Technologies International, Inc., North Kingstown, RI (US)

(*) Notice: Subject to any disclaimer, the term of this patent is extended or adjusted under 35 U.S.C. 154(b) by 283 days.

(21) Appl. No.: 14/946,182

(22) Filed: Nov. 19, 2015

(65) Prior Publication Data
US 2016/0143182 A1    May 19, 2016

Related U.S. Application Data

(60) Provisional application No. 62/081,726, filed on Nov. 19, 2014.

(51) Int. Cl.
F24F 7/00 (2006.01)
H05K 7/20 (2006.01)
(Continued)

(52) U.S. Cl.
CPC ...... H05K 7/20145 (2013.01); F24F 11/0001 (2013.01); F24F 13/10 (2013.01);
(Continued)

(58) Field of Classification Search
CPC ............. H05K 7/20145; H05K 7/2059; H05K 7/20172; F24F 13/10; F24F 11/001; F24F 2011/0002
See application file for complete search history.

(56) References Cited

U.S. PATENT DOCUMENTS

| 8,120,911 B2* | 2/2012 | Zhou | G06F 1/206 361/694 |
| 8,251,786 B2* | 8/2012 | Gasser | A62C 2/18 454/254 |
| 2009/0013703 A1* | 1/2009 | Werner | F24F 5/0046 62/180 |

FOREIGN PATENT DOCUMENTS

JP    H1089761 A  *  4/1998

OTHER PUBLICATIONS

Matsuno et al., Damper Device, Apr. 10, 1998, JPH1089761A, Whole Document.*

* cited by examiner

*Primary Examiner* — Larry Furdge
(74) *Attorney, Agent, or Firm* — Armis Intellectual Property Law, LLC

(57) ABSTRACT

A ventilation closure device for a telecommunication equipment enclosure includes opposed planar panels and aligned openings through each of the panels for passage of air therethrough for ventilating ambient atmospheric air to or from an equipment enclosure. One or more closures are disposed between the opposed panels and adapted to be drawn across the aligned openings for preventing passage of air, and a pivotal attachment to the closures disposes the closure into alignment with the opening. An actuator pivots the closures between an open position for allowing air passage through the openings and a closed position for impeding airflow. The pivotal attachment counterbalances the closures for mitigating force to pivot the closures. Counterbalancing of the closures minimizes actuation force required for drawing the closures across the openings.

19 Claims, 8 Drawing Sheets

(51) Int. Cl.
  *F24F 11/00* (2018.01)
  *F24F 13/10* (2006.01)
(52) U.S. Cl.
  CPC ....... *H05K 7/2059* (2013.01); *H05K 7/20172* (2013.01); *F24F 2011/0002* (2013.01)

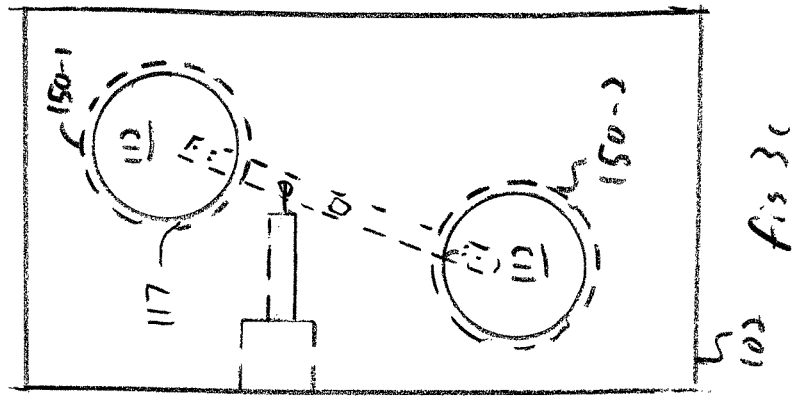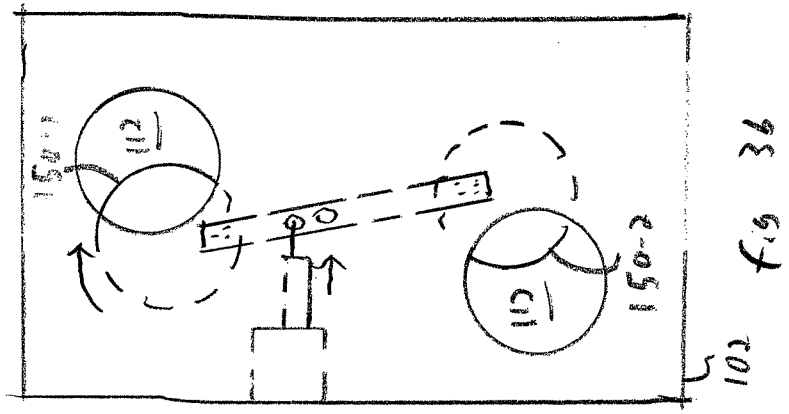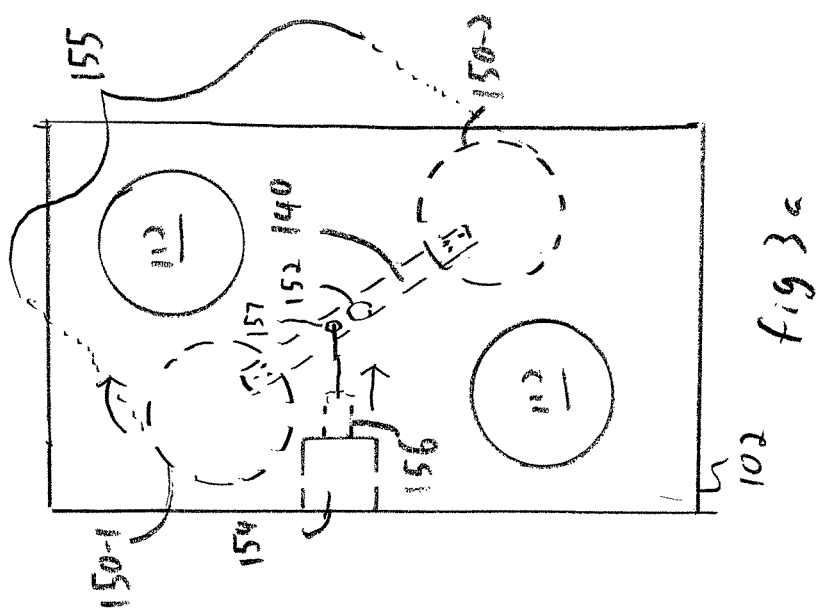

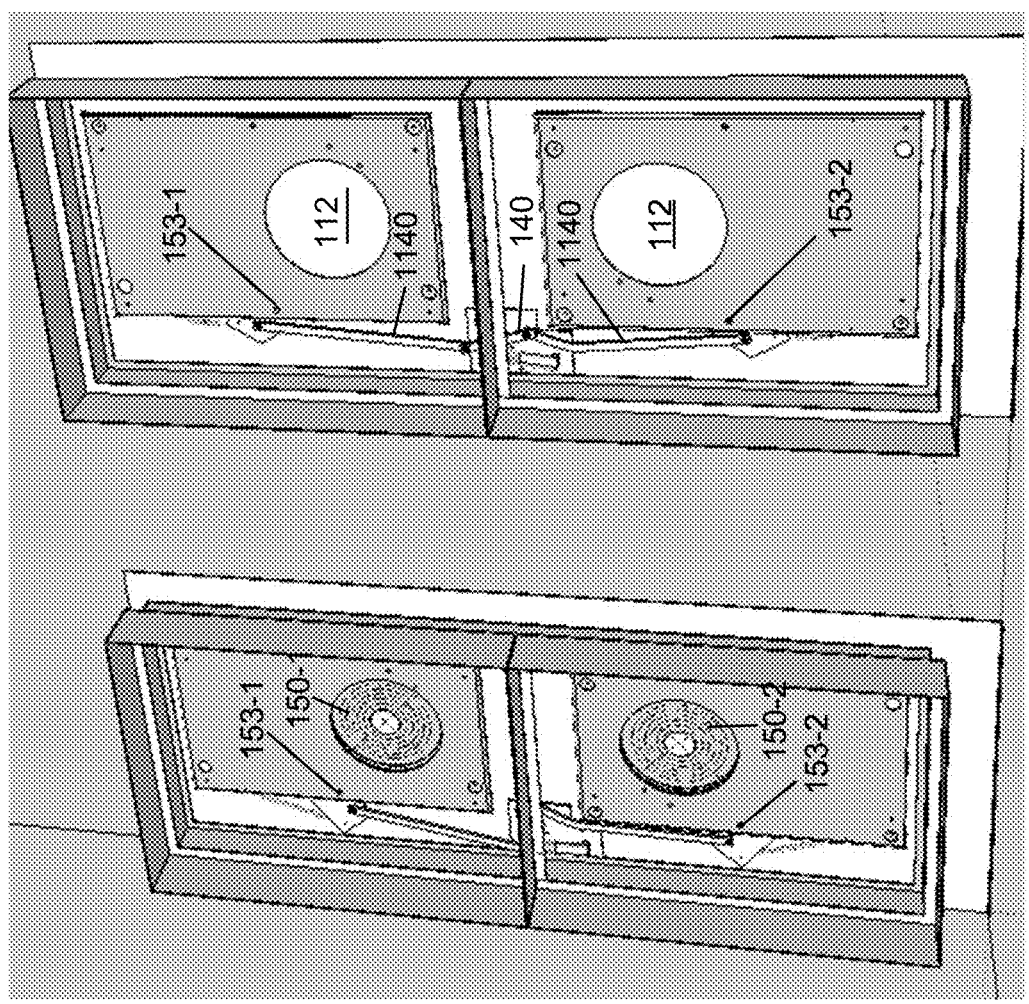

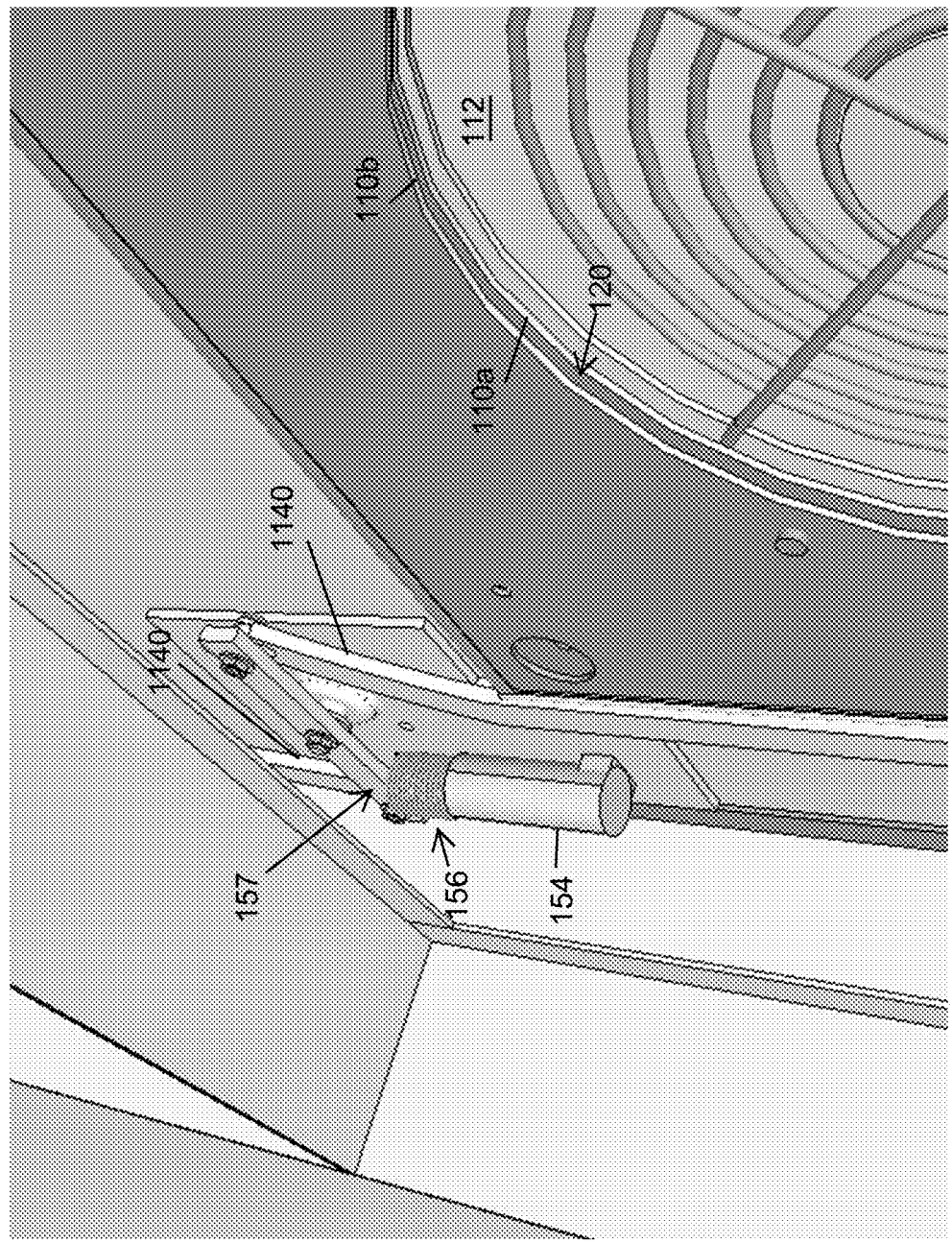

VENT CONTROL APPARATUS AND METHOD

RELATED APPLICATIONS

This application claims the benefit under 35 U.S.C. § 119(e) of U.S. Provisional Patent Application No. 62/081,726 filed Nov. 19, 2014, entitled "VENTILATION APPARATUS AND METHOD," incorporated herein by reference in entirety.

BACKGROUND

Machine rooms and enclosures for telecommunications and other computing equipment have specialized ventilation needs due to the heat generated as a byproduct of operation. Such enclosures are typically only as large as necessary to house the corresponding equipment, and therefore prone to heat buildup if not adequately cooled or ventilated. Conventional approaches outfit these enclosures with air conditioning systems to offset the heat gain, however are often only equipped to generate an alarm in the event of equipment malfunction. Failure of the native AC system presents problems of overheated equipment and downtime until maintenance personnel can be notified and transported to the failed system location.

Ventilation systems for telecommunications enclosures and machine rooms may include an ambient air exchange system to supplement the native cooling and as a failover in the case of failure. Such systems may be that as disclosed in co-pending U.S. patent application Ser. No. 14/946,055, filed Nov. 19, 2015, entitled "VENTILATION CONTROL APPARATUS AND METHOD," incorporated herein by reference. Ambient air exchange systems circulate outside air for cooling equipment when it is beneficial to do so. Such a system reduces runtime and power cycles in the native HVAC system, and also provide failover capability to ventilate if the native AC fails. Such a system incorporates one or more exterior vents to outside atmospheric air for selective exchange and exhausting of air inside the enclosure.

SUMMARY

A ventilation closure device for a telecommunication equipment enclosure includes opposed planar panels and aligned openings through each of the panels for passage of air therethrough for ventilating ambient atmospheric air to or from an equipment enclosure. One or more closures are disposed between the opposed panels and adapted to be drawn across the aligned openings for preventing passage of air, and a pivotal attachment to the closures disposes the closure into alignment with the opening. An actuator pivots the closures between an open position for allowing air passage through the openings and a closed position for impeding airflow. The pivotal attachment counterbalances the closures for mitigating force to pivot the closures.

Telecommunications equipment and other heat generating electronics, such as power supplies, transformers, routers and switches require near constant circulation of cooled air to prevent overheating. Such equipment is often housed in an enclosure or cabinet for focusing delivery of cooling air. The circulated air may be refrigerated, from a compressor based HVAC (Heating, Ventilation and Air Conditioning) system, ambient outside air exchanged with the enclosure, or a combination. Particularly in the case of a combined system of ambient air and HVAC cooling, it is desirable to partition sources of cooled air so that refrigerated air is not lost to the atmosphere, and so that unimpeded ambient airflow is available when needed. A vent closure selectively opens a passage or vent when airflow is desired, and substantially restricts or seals against airflow when closed.

Configurations herein are based, in part, on the observation that automated ventilation passages such as louvered openings having an array of parallel, coplanar slats that rotate in common to substantially obscure the ventilation passage. Unfortunately, conventional approaches suffer from the shortcoming that louver assemblies are prone to misalignment and wear due to the large number of moving parts and lightweight, rigid construction for reducing mechanical force required to open and close the louver or other conventional ventilation control such as iris gates or butterfly valves. Further, rotating louver blades and butterfly valves remain in the airstream and thus restrict airflow and when they rotate to close, they must push against the airstream which increases the force required from the actuator to close the opening. Over time, worn louver blades fall out of alignment, become sluggish and/or erratic in movement, and may deform from physical contact and environmental factors such as hail, wind and other factors. The unaligned louver blades fail to seal completely, and may even become inoperable if sufficiently deformed. Accordingly, configurations herein substantially overcome the above described shortcomings by disposing a pair of counterbalanced closures between opposed planar panels having aligned openings for air passage. The closures are circular or other shape of a similar and slightly larger shape than the aligned openings such that the closures obscure or block the opening by parallel movement when aligned with the openings between the panels. Counterbalancing of the closures, such as by attachment to opposed ends of an elongated, pivoting member or spring biased member, minimizes actuation force required for drawing the closures across the openings. Further, since parallel plane gate closes by cutting across the airflow instead of needing to overcome the force of the air flowing over it to rotate into place, movement in direct opposition to airflow is avoided.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIGS. 3a-3c show a sequence of operations of the ventilation closure device of FIG. 1;

FIGS. 5a and 5b are a perspective view of an alternate configuration;

FIG. 8 shows an actuator in the configuration of FIGS. 5a and 5b.

DETAILED DESCRIPTION

Depicted below is a particular configuration of the ventilation closure device for a telecommunications equipment enclosure. The automated vent design and method of operation as disclosed is applicable to any arrangement where remote vent closure is needed, not only in remote machine enclosures but also in commercial and residential HVAC (Heat/Ventilation/Air Conditioning) systems, and other applications where selective closure of gaseous flow or exhaust is beneficial.

A particular configuration shown below shows two closures attached by a common elongated pivot member. In such a configuration, as discussed below, a fan tray ventilation closure device for a telecommunication equipment enclosure includes a pair of opposed planar panels defining a closure void. A plurality of aligned openings through each of the opposed panels allow for passage of fan-forced air therethrough, in which each aligned opening corresponds to an aligned opening in the opposed planar panel. Thus, the coplanar panels have similarly positioned vent holes that, when placed together, form a continuous passage through both openings. For closing the vent, the counterbalanced or cantilevered closures, which are disposed in a coplanar manner in the closure void between the opposed panels, are adapted to be drawn in a parallel direction across the openings for preventing passage of air, such that each counterbalanced closure is attached to a respective end of the elongated pivotal attachment. The pivotal attachment is adapted to dispose each closure into alignment with a corresponding aligned opening, and is pivotally attached to a pivot point such as a bearing, pin or axle on the opposed panels. An actuator attaches to the pivotal attachment for pivoting the closures between an open position for allowing air passage through the opening and a closed position for impeding airflow by rotating the pivotal attachment slightly to bring the closures into alignment with the corresponding openings.

Figure 1:
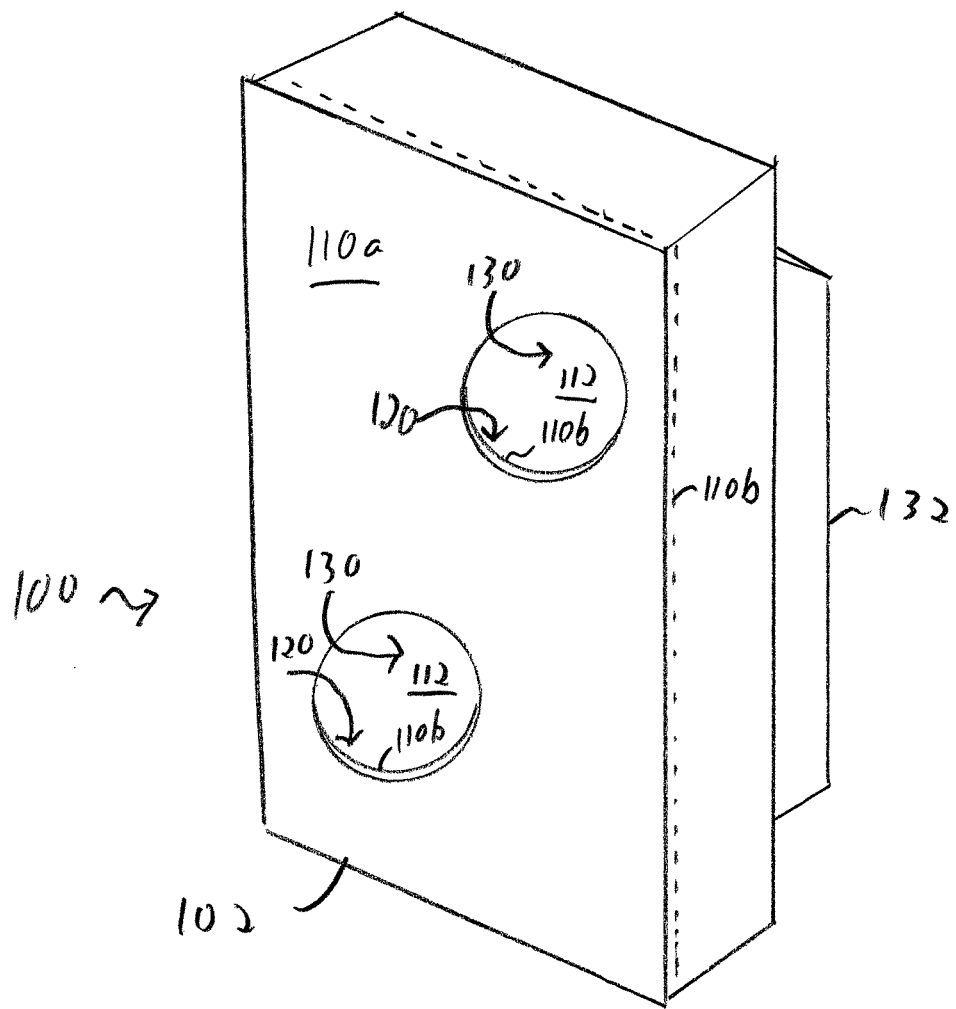
FIG. 1 is a perspective view of a ventilation closure device disposed in a fan tray assembly.

Various components of the disclosed approach are detailed in the description and Figures that follow. FIG. 1 is a perspective view of the ventilation closure device disposed in a fan tray assembly. Referring to FIG. 1, the ventilation closure device 100 includes a housing 102, or fan tray, including opposed coplanar panels 110a and 110b (110 generally), in close proximity having a closure void 120 defined by the area between the opposed panels 110. Aligned openings 112 in each opposed panel define an airflow passage 130. The aligned openings 112 define a transverse passage 130 substantially perpendicular to the opposed panels 110 and responsive to forced air through the passage 130. A fan box 132 houses one or more fans for drawing or forcing air through the airflow passage 130. The housing 102 is adapted for sealing engagement with a wall or cabinet defining an enclosure for telecommunication or other electronic, heat generating equipment. The housing 102 includes a frame adapted for placement between an enclosure and an ambient air environment for exchanging air from the ambient air environment with air in the enclosure 1110.

The housing 102 includes a frame, such that the frame maintains the opposed panels 110 in sealing engagement with the equipment enclosure, such that the closures 150 (FIG. 3a, below) are adapted for pivotal movement between the open and closed positions within the frame. A rectangular shape of the frame and housing 102 assures a tight seal in a dimensional cutout within the enclosure 1110 wall.

Figure 2:
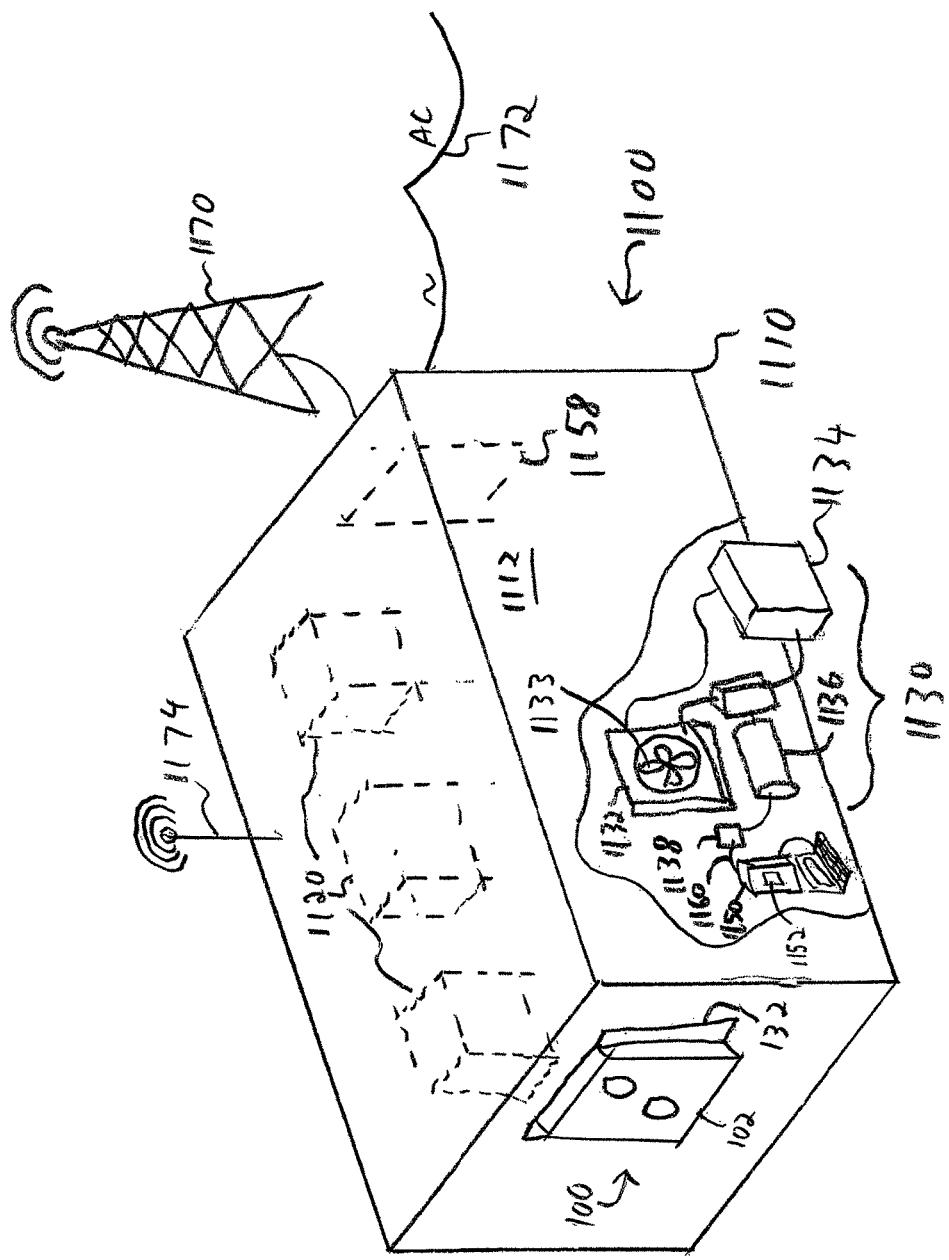
FIG. 2 is an enclosure suitable for use with the fan tray configurations herein.

FIG. 2 is an enclosure suitable for use with the housing 102 configurations herein. Referring to FIGS. 1 and 2, in a telecommunications environment 1100, an enclosure 1110 houses a machine room 1112 for storing and operating telecommunications equipment 1120, such as switching and routing equipment, power supplies, antenna amplifiers, and associated computers and processing devices. An HVAC system 1130 provides the native control and includes an evaporator 1132 and fan 1133 for blowing cooled air, a compressor 1136, a condenser 1134 outside the enclosure, and a thermostat 1138 or other control for switching the compressor 1136 and other HVAC components. The cooling operation of the HVAC system 1130 is generally most often used, to offset the high heat given off by the equipment 1120, and heating is rarely, if ever, called for.

A controller 1150 includes air exchange logic 1152 in the form of a circuit and/or application, and operates the intake fan 132 and also controls the HVAC system 1030 via an interface 1060 to the thermostat 1038 for providing thermostatic control over the HVAC system 1030. The ventilation closure device 100 is mounted via the housing 102 in a wall of the enclosure 1110 for isolating the machine room 1112 when the intake fan 132 is idle, and opens to permit fan driven ambient air flow when called upon by the controller 1150. One or more complementary output vents 1158 are also operated by similar closures to permit exhaust of the fan forced ambient air. The actuator is responsive to the controller 1152 for mediating temperature in the equipment enclosure 1110 by selectively permitting ambient air exchange via the aligned openings 112. The actuator 154 (FIG. 3a) may be coupled to a second actuator for opening the complementary vent 1158 for exhausting the exchanged air from the enclosure, and are respectively responsive to the controller 1150. The intake fan 132 (or exhaust fan) are attached to the frame, such that the fan is adapted for forcing air through the openings.

A telecommunications tower 1170, such as a cell tower or TV/radio transmission beacon is responsive to the equipment 1120 for throughput support, and AC lines 1172 provide electrical power. A local antenna 1174 provides Internet connectivity for the controller via WiFi or 4GL wireless links under IEEE 802.11 connectivity; alternatively a hardwired Ethernet cable or other Internet LAN may also be provided.

FIGS. 3a-3c show a sequence of operations of the ventilation closure device of FIG. 1. In FIGS. 3a-3c, closures 150-1 . . . 150-2 (150 generally) are attached to ends of a pivotal member 140 that provides a pivotal attachment between the closures 150 around a pivot point 152. The pivoting member 140 and closures 150 define a closure assembly 155 that rotates in the closure void 120. An actuator 154 drives a shaft 156 connected to the pivoting member 140 for disposing the closures 150 into alignment with the openings 112. A linkage 157 connects the shaft 156 to the pivoting member 140 slightly offset from the pivot point 152 for moving or rotating the pivoting member 140 and attached closures 150.

In operation, the closures 150 are disposed or drawn across the aligned openings 112 for impeding airflow, defining a closed position. Retraction of the closures defines an open position for permitting airflow. A plurality of closures 150, each corresponding to a respective pair of aligned openings 112 in each opposed panel 110 may be employed, or a single enclosure with a counterbalanced weight or spring, may also be employed. The closures 150 are suitably shaped panels having dimensions based on the aligned openings 110 for substantially obscuring the aligned openings 112 in the closed position. The closures generally have a slightly larger shape or circumference than the corresponding aligned openings 112 to provide a slight overlap, or lip 117 (FIG. 3c) to maintain a sealing engagement and prevent leakage between the panels 110 and closure 150 in the closure void 120. The examples shown depict aligned openings that are circular, in which the closures 150 are circular panels of a larger diameter than the aligned openings 112.

In the example configuration, the closures 150 are attached to an elongated, rigid member defining the pivotal attachment, such that the rigid member (pivoting member 140) has a pivot point 152 substantially centered between the closures 150. The pivot point 152 provides a balanced offset of gravitational force on each of the closures 150, and the rigid member is in communication with the actuator for disposing the rigid member in a pivotal manner for disposing the closures 110 across respective aligned openings 112. The closure is therefore counterbalanced and/or cantilevered across the pivot point, and may be offset by either the actuator or a spring to ensure sufficient force to open and close the closure 150. In the example arrangement, the rigid member has opposed ends, such that each end is attached to a respective closure 150 for providing selective closure of two sets of opposed openings 112 in the panels 110a, 110b. Multiple closures 150 may also be attached in a triangular, quad, or any suitable number around a central point such that the center of gravity of the pivoting member 140 and attached closures 150 is substantially defined by the pivot point 152.

The closure 150 is slightly larger than the aligned opening 112, defining a lip 117 in the closure void 120. In addition to providing a greater seal, since the edge of the closure 150 remains concealed in the closure void, tampering from outside sources such as intruders and animals is prevented because an edge of the closure 150 is inaccessible.

Alternate configurations may employ various actuation mechanisms, such as sliding, gear driven or spring loaded mechanisms for imparting coplanar movement of the closures 150 relative to the panels 110. Any suitable number of closures may be provided; the example configuration employs two closures 150-1, 150-2 to illustrate the counterbalanced and cantilever configuration that mitigates the force needed by the actuator 154 to dispose the pivoting member 140 between the open position, shown in FIG. 3a, and the closed position shown in FIG. 3c.

The closure void 120 has sufficient width for permitting movement of the closure assembly 155, but operates within tolerances sufficient to seal or substantially impede airflow through the openings 112 when in the closed position and allows free airflow through the openings in the opened position. FIG. 3a shows the closed position where the closure assembly 155 is rotated out of alignment with the openings 112. In FIG. 3b, the actuator disposes the shaft 156 to pivot the assembly 155 such that the closures 112 are drawn across the openings 112. In FIG. 5c, the closures 112 completely obscure the openings 112 as the assembly pivots or rotates to the closed position. Flexible gaskets or sealing material such as foam rubber or nylon brushes may be used to further mitigate air seepage. Further, any pressure difference will tend to bias the closures against the panels 110 on the lip 117, to maintain a sealing engagement.

Figure 4A:
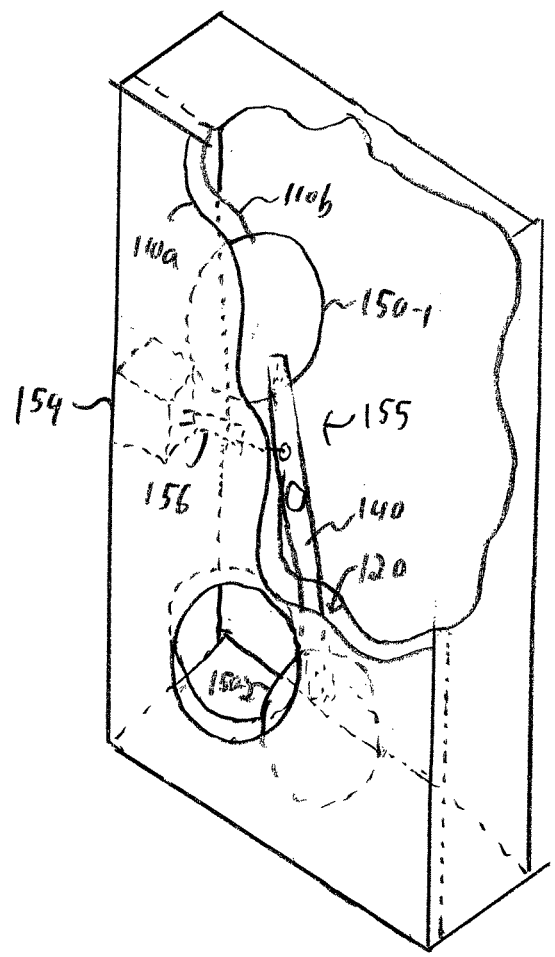
FIG. 4a is a partial cutaway perspective view of the ventilation closure device of FIG. 1.

FIG. 4a is a partial cutaway perspective view of the ventilation closure device of FIG. 1. Referring to FIGS. 1, 3a and 4, the closure void 120 is defined by a region between the opposed panels 110. The closure assembly 155 rotates around the pivot point 152 by an axle or bearing and bushing assembly mounted on one or both of the panels. Other suitable pivotal attachments may be employed. The closures 110 move within the narrow clearance in the closure void for travel between the open and closed position.

Figure 4B:
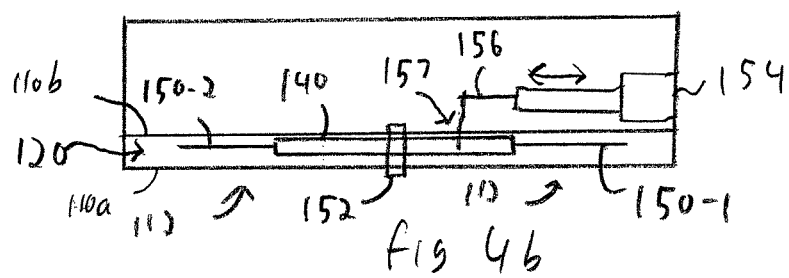
FIG. 4b is a top view of the ventilation closure device of FIG. 1.

FIG. 4b is a top view of the ventilation closure device of FIG. 1. Referring to FIGS. 4a and 4b, the actuator 154, such as a stepper motor or piston arrangement, imparts a linear force to the shaft 156 via a linkage 157 for disposing the pivoting member 140 into rotation around the pivot point 152 for drawing and retracting the closures 150. The linkage 157 includes a pin or hole for allowing a rotary motion of the pivoting member 140. The closure assembly 155 is shown in a closed position, as the closures 150-1 and 150-2 align with the openings 112. In this manner, movement of the closures 150 in a substantially parallel manner to the panels 110a and 110b in the closure void 120 between the panels 110 provides a sealing engagement of the closures 110 over the openings 112 sufficient for sealing the enclosure 1110 for environmental and fire separation by counterbalancing the closures 150-1, 150-2 to minimize force required from the actuator 154, and within the confines of the housing 102 for locating the ventilation closure device 100 in a rectangular opening in a telecommunications enclosure 1110. In a single closure configuration, disclosed further below, a counterbalance effect may be enhanced by a spring or accommodated by force of the actuator 154.

An alternate arrangement of the parallel planar closure approach may be employed. FIGS. 5a and 5b are a perspective view of an alternate configuration. Referring to FIGS. 5a and 5b, an elongated arm 1140 attaches to each end of the pivoting member 140. Each closure 150-1, 150-2 has a dedicated closure pivot 153-1, 153-2 around which the respective closure 150-1, 150-2 pivots across the opening 112 in response to movement of the elongated arm 1140.

Figure 6B:
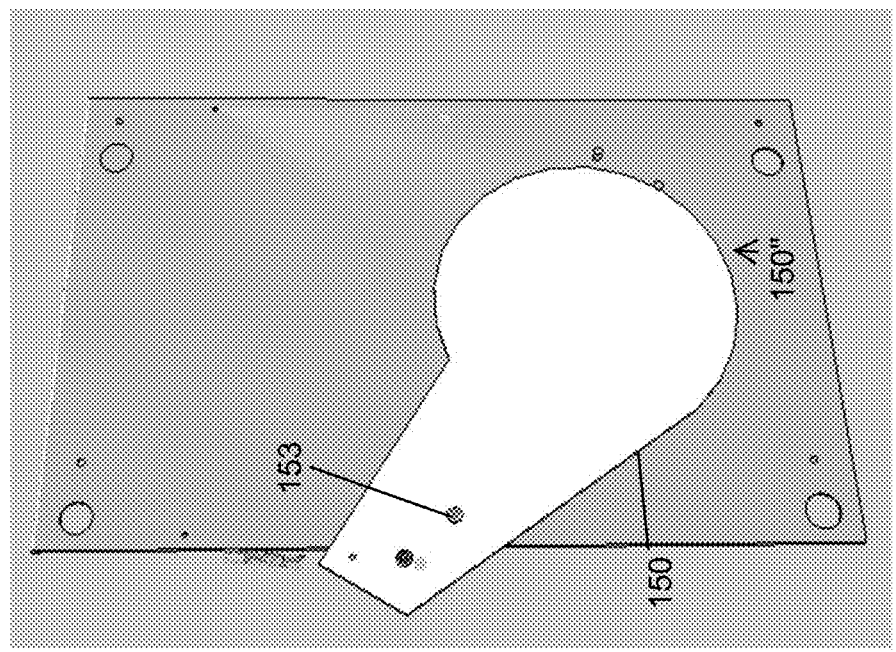
FIGS. 6a and 6b show a single closure configuration of the apparatus of FIGS. 5a and 5b.
Figure 6A:
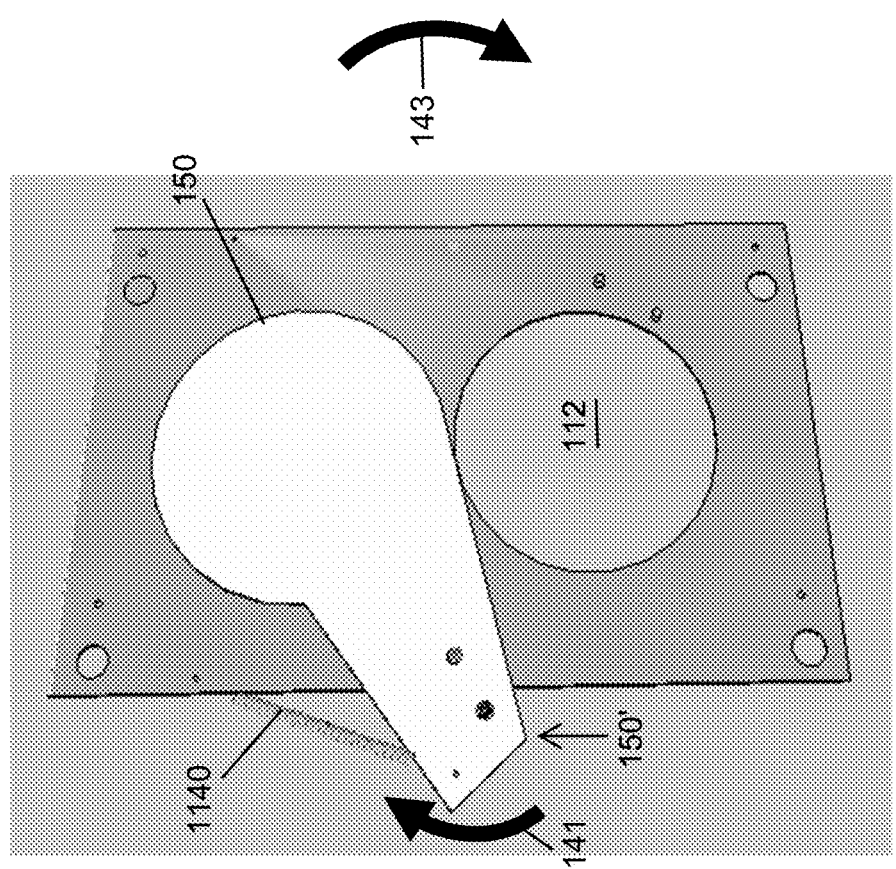

FIGS. 6a and 6b show a single closure configuration of the apparatus of FIGS. 5a and 5b. Referring to FIGS. 6a and 6b, the closure 150 pivots around the closure pivot point 153 in response to the elongated arm 1140. The closure 150 is counterbalanced by a portion 150' of the closure opposite the closure pivot 153, and may also be offset by spring biasing and the force of the elongated arm 1140 to provide sufficient force for opening and closing. In FIG. 6a, retraction of the elongated arm 1140 upwards, as shown by arrow 141, causes downward movement of the closure 150, as shown by arrow 143. Extension of the elongated arm 1140 in FIG. 6b retracts the closure 150 from the opening 112 by generating sufficient downward force on the portion 150' to generate upward force on the substantially circular portion 150", and may be biased by springs or other mechanisms in addition to the counterbalance effect of portion 150'.

Figure 7:
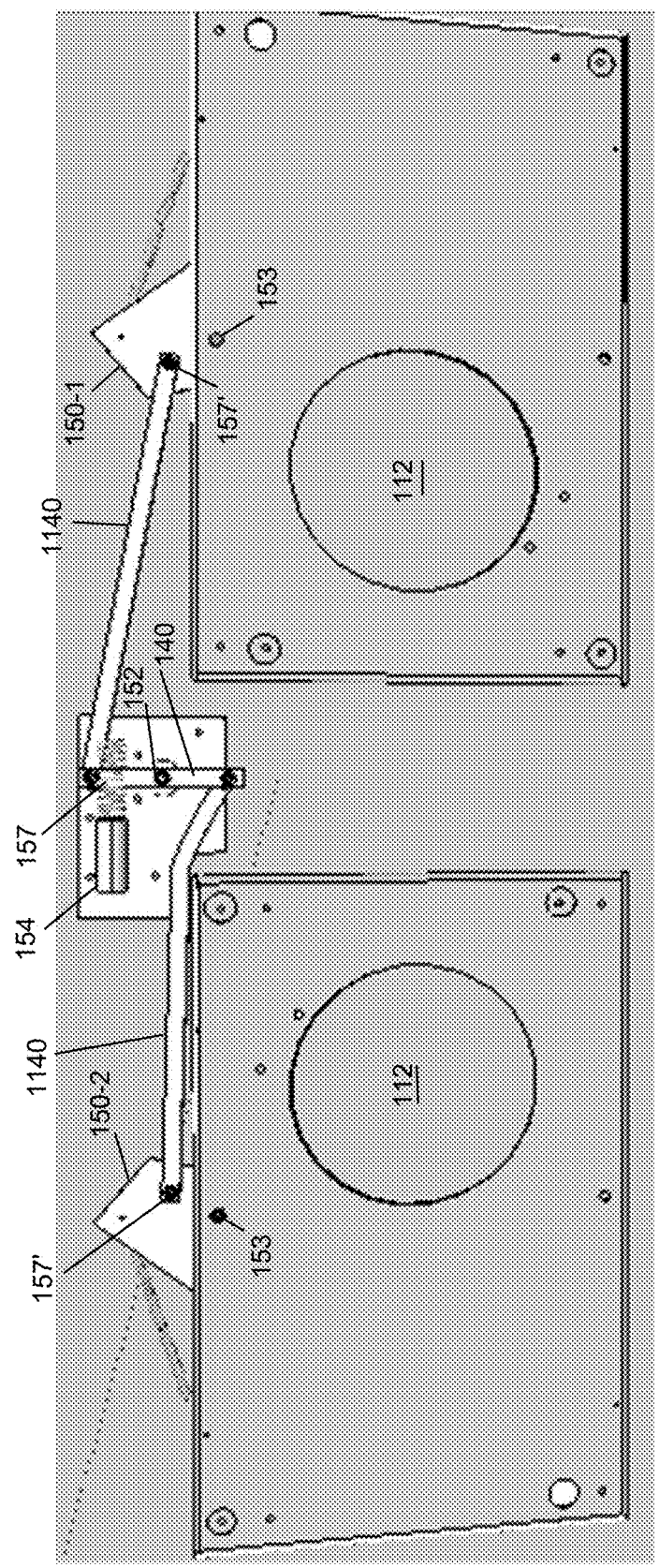
FIG. 7 shows a plan view of the configuration of FIGS. 5a and 5b.

FIG. 7 shows a plan view of the configuration of FIGS. 5a and 5b. Referring to FIGS. 5a, 5b and 7, in operation the actuator 154 extends or retracts to rotate the pivoting member 140 around the pivot point 152 via the linkage 157. The elongated arms 1140 attach to the ends of the pivoting member 140 and to the closure pivot 157' for disposing the closures 150-1, 150-2 around the closure pivot 153 for disposing the closures 150 across the opening 112.

FIG. 8 shows an actuator in the configuration of FIGS. 5a and 5b. Referring to FIGS. 4a, 4b and 8, the actuator 154 connects via the shaft 156, (which may have a boot or dust fitting) to the pivoting member 140 at the linkage 157. The pivoting member 140 disposes the elongated arms 1140 to align the closures 150 within the closure void 120 between the opposed panels 110a, 110b for closing the opening 112.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. A ventilation closure device for a telecommunication equipment enclosure, comprising:
   opposed planar panels;
   an aligned opening through each of the panels for passage of air therethrough;
   a plurality of closures, each disposed between the opposed panels and adapted to be drawn across the opening for preventing passage of air, each closure of the plurality of closures corresponding to a respective aligned opening in each opposed panel;
   a pivotal attachment for disposing the closure into alignment with the opening, the pivotal attachment counterbalancing one of the closures with at least one other closure for mitigating force to pivot the closures; and
   an actuator for pivoting the closure between an open position for allowing air passage through the opening and a closed position for impeding airflow.

2. The device of claim 1 further comprising a frame, the frame housing the opposed panels in sealing engagement with the equipment enclosure, the closures adapted for pivotal movement between the open and closed positions within the frame.

3. The device of claim 1 wherein the actuator is responsive to an environmental controller for mediating temperature in the equipment enclosure by selectively permitting ambient air exchange via the aligned opening.

4. The device of claim 2 further comprising a fan attached to the frame, the fan adapted for forcing air through the openings.

5. The device of claim 1 wherein the aligned openings define a transverse passage substantially perpendicular to the opposed panels and responsive to forced air through the passage.

6. The device of claim 1 wherein the frame is adapted for placement between an enclosure and an ambient air environment for exchanging air from the ambient air environment with air in the enclosure, the actuator coupled to a second actuator for opening a complementary vent for exhausting the exchanged air from the enclosure.

7. The device of claim 1 wherein the closures further comprise shaped panels having dimensions based on the aligned openings for substantially obscuring the aligned openings in the closed position.

8. The device of claim 1 wherein the aligned openings are circular and the closures include substantially circular portions of a larger diameter than the aligned openings.

9. The device of claim 1 wherein the closures are attached to an elongated, rigid member defining the pivotal attachment, the rigid member having a pivot point substantially centered between the closures, the pivot point providing a balanced offset of gravitational force on each of the closures, the rigid member in communication with the actuator for disposing the rigid member in a pivotal manner for disposing the closures across respective aligned openings.

10. The device of claim 1 wherein the rigid member has opposed ends, each end attached to a respective closure for providing selective closure of two sets of opposed openings.

11. In a telecommunications equipment enclosure having both refrigerated cooling and ambient air exchange for mitigating heat buildup, a method of controlling a ventilation closure device for circulating outside air, comprising:
   disposing a plurality of closures simultaneously between opposed panels, each opposed panel having an opening aligned with a corresponding opening in the opposed panel for passage of air therethrough, the closure adapted to be drawn across and into alignment with the openings for preventing passage of air, each closure of the plurality of closures corresponding to a respective aligned opening in each opposed panel, each closure extending from a pivotal attachment for disposing the closure into alignment with the opening;
   disposing including powering an actuator for pivoting the closure between an open position for allowing air passage through the opening, and a closed position for impeding airflow, the pivotal actuation counterbalancing one of the closures with at least one other closure for mitigating force to pivot the closures,
   the aligned openings defining a transverse passage substantially perpendicular to the opposed panels and responsive to forced air through the passage.

12. The method of claim 11 further comprising powering the actuator responsive to a signal from a controller based on a difference between a sensed temperature in the telecommunications enclosure and a sensed ambient air temperature outside the enclosure.

13. The method of claim 11 further comprising locating the panels in a frame, the frame housing the opposed panels in sealing engagement with the equipment enclosure, the closures adapted for pivotal movement between the open and closed positions within the frame.

14. The method of claim 13 further comprising powering a fan attached to the frame, the fan adapted for forcing air through the openings.

15. The method of claim 11 wherein the frame is adapted for placement between an enclosure and an ambient air environment for exchanging air from the ambient air environment with air in the enclosure, the actuator coupled to a second actuator for opening a complementary vent for exhausting the exchanged air from the enclosure.

16. The method of claim 11 wherein the closures are attached to an elongated, rigid member defining the pivotal attachment, the rigid member having a pivot point substantially centered between the closures, the pivot point providing a balanced offset of gravitational force on each of the closures, the rigid member in communication with the actuator for disposing the rigid member in a pivotal manner for disposing the closures across respective aligned openings.

17. The method of claim 16 wherein the rigid member has opposed ends, each end attached to a respective closure for providing selective closure of two sets of opposed openings.

18. A fan tray ventilation closure device for a telecommunication equipment enclosure, comprising:
   a pair of opposed planar panels defining a closure void;
   a plurality of aligned openings through each of the opposed panels for passage of air therethrough, each aligned opening corresponding to an aligned opening in the opposed planar panel;
   counterbalanced closures disposed in a coplanar manner in the closure void between the opposed panels and adapted to be drawn in a parallel direction across the openings for preventing passage of air, each closure of the plurality of closures corresponding to a respective aligned opening in each opposed panel and each counterbalanced closure attached to a respective end of an elongated pivotal attachment;

the pivotal attachment counterbalancing one of the closures with at least one other closure for mitigating force to pivot the closures and adapted to dispose each closure into alignment with a corresponding aligned opening and pivotally attached to a pivot point on at least one of the opposed panels;

an actuator attached to the pivotal attachment for pivoting the closures between an open position for allowing air passage through the opening and a closed position for impeding airflow.

19. The device of claim 1, wherein the closures attach to a pivot and are adapted for rotation around the pivot in response to the counterbalanced actuation into an impeding configuration between fixed aligned openings in the opposed panels.

* * * * *